United States Patent
Madas et al.

(10) Patent No.: US 10,435,017 B2
(45) Date of Patent: Oct. 8, 2019

(54) METHOD FOR PROVIDING AN OBJECT PREDICTION REPRESENTATION

(71) Applicants: Volvo Car Corporation, Gothenburg (SE); Volvo Truck Corporation, Gothenburg (SE)

(72) Inventors: David Madas, Gothenburg (SE); Jonatan Silvlin, Gothenburg (SE); Andreas Eidehall, Molndal (SE); Peter Sundstrom, Gothenburg (SE)

(73) Assignees: VOLVO CAR CORPORATION, Gothenburg (SE); VOLVO TRUCK CORPORATION, Gothenburg (SE)

(*) Notice: Subject to any disclaimer, the term of this patent is extended or adjusted under 35 U.S.C. 154(b) by 67 days.

(21) Appl. No.: 15/305,186

(22) PCT Filed: May 7, 2015

(86) PCT No.: PCT/EP2015/060080
§ 371 (c)(1),
(2) Date: Oct. 19, 2016

(87) PCT Pub. No.: WO2015/169905
PCT Pub. Date: Nov. 12, 2015

(65) Prior Publication Data
US 2017/0043769 A1    Feb. 16, 2017

(30) Foreign Application Priority Data
May 8, 2014 (EP) .................................... 14167466

(51) Int. Cl.
*B60W 30/09* (2012.01)
*G06F 17/50* (2006.01)
(Continued)

(52) U.S. Cl.
CPC .......... *B60W 30/09* (2013.01); *B60W 30/095* (2013.01); *B60W 30/0953* (2013.01);
(Continued)

(58) Field of Classification Search
None
See application file for complete search history.

(56) References Cited

U.S. PATENT DOCUMENTS

| 5,892,462 A | 4/1999 | Tran |
| 2002/0177953 A1 | 11/2002 | Okamura et al. |

(Continued)

FOREIGN PATENT DOCUMENTS

| CN | 101636304 A | 1/2010 |
| CN | 102806912 A | 12/2012 |

(Continued)

OTHER PUBLICATIONS

Chinese Office Action dated Mar. 13, 2018.
(Continued)

*Primary Examiner* — Thomas G Black
*Assistant Examiner* — Demetra R Smith-Stewart
(74) *Attorney, Agent, or Firm* — Harness, Dickey & Pierce, P.L.C.

(57) ABSTRACT

A method is for providing an object prediction representation. In an embodiment, the method includes simulating movement of a host vehicle and an object in a longitudinal-lateral coordinate system based on their initial positions at the starting time and a movement of the host vehicle and determined movement of the object. Points in time when at least one reference point of the host vehicle and an object reference point of a plurality of object reference points have the same longitudinal position are detected. Further, for each
(Continued)

detected point in time, an associated lateral position of the object reference point at the detected point in time is detected.

19 Claims, 7 Drawing Sheets

(51) Int. Cl.
  *G08G 1/16* (2006.01)
  *B60W 30/095* (2012.01)
  *B62D 15/02* (2006.01)
  *B60W 50/00* (2006.01)
  *B60W 40/04* (2006.01)

(52) U.S. Cl.
  CPC ........ *B60W 30/0956* (2013.01); *B60W 40/04* (2013.01); *B60W 50/0097* (2013.01); *B62D 15/0265* (2013.01); *G06F 17/5009* (2013.01); *G08G 1/163* (2013.01); *G08G 1/166* (2013.01); *B60W 2550/10* (2013.01); *B60W 2550/30* (2013.01); *B60W 2900/00* (2013.01)

(56) References Cited

U.S. PATENT DOCUMENTS

| | | | |
|---|---|---|---|
| 2004/0090117 | A1 | 5/2004 | Dudeck et al. |
| 2005/0125155 | A1 | 6/2005 | Kudo |
| 2005/0192749 | A1 | 9/2005 | Flann et al. |
| 2008/0208408 | A1 | 8/2008 | Arbitmann et al. |
| 2009/0024357 | A1 | 1/2009 | Aso et al. |
| 2009/0143951 | A1 | 6/2009 | Takahashi et al. |
| 2010/0209884 | A1 | 8/2010 | Lin et al. |
| 2010/0209886 | A1 | 8/2010 | Lin et al. |
| 2010/0209889 | A1 | 8/2010 | Huang et al. |
| 2010/0209890 | A1 | 8/2010 | Huang et al. |
| 2010/0211270 | A1 | 8/2010 | Chin et al. |
| 2010/0299121 | A1* | 11/2010 | Bond ................ A63F 13/10 703/6 |
| 2011/0106361 | A1 | 5/2011 | Staempfle et al. |
| 2011/0187515 | A1* | 8/2011 | Saito ................ B60T 7/22 340/425.5 |
| 2013/0054128 | A1 | 2/2013 | Moshchuk et al. |
| 2013/0249948 | A1* | 9/2013 | Reitan ................ G06F 3/011 345/633 |
| 2014/0063061 | A1* | 3/2014 | Reitan ................ G09G 3/003 345/633 |
| 2014/0303883 | A1 | 10/2014 | Aso et al. |
| 2015/0298621 | A1* | 10/2015 | Katoh ................ B60R 11/04 348/148 |

FOREIGN PATENT DOCUMENTS

| | | |
|---|---|---|
| CN | 102959600 A | 3/2013 |
| CN | 102963358 A | 3/2013 |
| DE | 102006042666 A1 | 3/2008 |
| EP | 1990786 A1 | 11/2008 |
| JP | 2006-154967 A | 6/2006 |
| JP | 2012173786 A | 9/2012 |
| JP | 2013196601 A | 9/2013 |

OTHER PUBLICATIONS

Chinese Office Action dated Feb. 11, 2018.
International Search Report PCT/ISA/210 for International Application No. PCT/EP2015/060082 dated Aug. 31, 2015.
Written Opinion of the International Searching Authority PCT/ISA/237 for International Application No. PCT/EP2015/060082 dated Aug. 31, 2015.
Extended European Search Report dated Oct. 24, 2014 issued in corresponding European Application No. 14167465.5.
International Search Report PCT/ISA/210 for International Application No. PCT/EP2015/060080 dated Jul. 24, 2015.
Written Opinion of the International Searching Authority PCT/ISA/237 for International Application No. PCT/EP2015/060080 dated Jul. 24, 2015.
U.S. Office Action dated May 17, 2018 issued in related U.S. Appl. No. 15/307,955.
U.S. Notice of Allowance for corresponding U.S. Appl. No. 15/307,955 dated Jan. 9, 2019.
U.S. Notice of Allowance for corresponding U.S. Appl. No. 15/307,955 dated May 2, 2019.

* cited by examiner

METHOD FOR PROVIDING AN OBJECT PREDICTION REPRESENTATION

This application is the national phase under 35 U.S.C. § 371 of PCT International Application No. PCT/EP2015/060080 which has an International filing date of May 7, 2015, which designated the United States of America and which claims priority to European patent application number EP14167466.3 filed May 8, 2014, the entire contents of which are hereby incorporated herein by reference.

FIELD OF THE INVENTION

The present invention relates to a method for providing an object prediction representation, which may be used for planning avoidance maneuvers. The present invention also relates to a corresponding computer program product. The present invention also relates to a vehicle.

BACKGROUND OF THE INVENTION

US2011/0018737 (Hsu et al.) discloses a vehicle collision avoidance system implemented in a host vehicle. A wireless communication module in the host vehicle wirelessly broadcasts vehicle information packages of the host vehicle and receives external vehicle information packages from other neighboring vehicles. Based on the received vehicle information packages, a collision avoidance process is performed. The process has steps of mapping coordinates system, categorizing collision zones, determining whether a possible collision position exists, calculating a collision time and outputting warning messages.

US2002/0135467 (Koike) discloses that predicted future positions are calculated and arranged into packets to be transmitted using a communication pattern based on a time and a position of each packet. Another vehicle calculates its predicted position and generates a communication pattern based on a result of calculation so that the generated communication pattern is utilized for reception. Consequently, data associated with a future position of its own can be selected for enabling reception. An existence probability is calculated, and the state of another vehicle can be understood from the communication of the calculated existence probability, thereby reducing chance of collision. FIG. 20 in US2002/0135467 shows position coordinates of a user's vehicle and another vehicle from present to a few seconds later, wherein a portion where the trajectory of the user's vehicle overlaps on that of the another vehicle is a portion which a collision can be expected in the future.

However, US2011/0018737 and US2002/0135467 both calculate collision probability assuming both host (vehicle) and object (e.g. neighboring vehicle) motions are known.

SUMMARY OF THE INVENTION

It is an object of the present invention to provide an improved method for providing an object prediction representation.

According to a first aspect of the present invention, there is provided a method for providing an object prediction representation, which method comprises: establishing a host vehicle in a longitudinal-lateral coordinate system at a starting time, the host vehicle being represented by at least one reference point in the coordinate system; detecting an object, and establishing the object in the coordinate system at the starting time, the object being represented by a plurality of object reference points along the perimeter of the object, wherein movement of the object is determined; simulating movement of the host vehicle and the object in the longitudinal-lateral coordinate system based on their initial positions at the starting time and a movement of the host vehicle and the determined movement of the object, wherein points in time when the at least one reference point of the host vehicle and an object reference point of the plurality of object reference points have the same longitudinal position are detected, and wherein for each detected point in time an associated lateral position of the object reference point at the detected point in time is detected; and establishing the object prediction representation in a time-lateral domain based on the detected points in time and the associated lateral positions.

The resulting object prediction representation in the time-lateral domain may beneficially be used for planning avoidance maneuvers of the host vehicle. In particular, lateral motion of the host vehicle may be decided to avoid the object as represented by the object prediction representation. That is, in contrast to both US2011/0018737 and US2002/0135467, host vehicle lateral motion is here not known beforehand but may be decided based on the resulting object prediction representation.

The "a movement" of the host vehicle may be the host vehicle's speed and heading. In other words, said movement may have a magnitude and a direction.

The at least one reference point of the host vehicle may comprise a front reference point and a rear reference point along the longitudinal direction of the host vehicle, the front reference points representing the front of the vehicle and the rear reference point representing the rear of the host vehicle. Alternatively, the at least one reference point of the host vehicle may be a single reference point, wherein the established object prediction representation is extended based on a length of the host vehicle and the movement of the host vehicle.

Further, establishing the object prediction representation in a time-lateral domain based on the detected points in time and the associated lateral positions may include constructing a convex hull around points in the time-lateral domain, which points are defined by the detected points in time and the associated lateral positions.

The plurality of object reference points may include four object reference points each representing a corner of the object.

The method may further comprise: generating an output signal for automatic control of movement of the host vehicle so as to avoid the established object prediction representation.

The object may be a moving object. Alternatively, it may be a stationary object.

The movement of the object and the initial position of the object at the starting time may be determined using at least one sensor on the host vehicle.

According to a second aspect of the present invention, there is provided a computer program product comprising code configured to, when executed by a processor or an electronic control unit, perform the method according to the first aspect. This aspects may exhibit the same or similar feature and/technical effects as the first aspect. The code may be stored on a computer readable medium.

According to a third aspect of the present invention, there is provided vehicle comprising an electronic control unit configured to perform the method according to the first aspect. This aspects may exhibit the same or similar feature and/technical effects as the first and second aspects.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing exemplary embodiments of the present invention, on which.

DESCRIPTION OF EXEMPLARY EMBODIMENTS

Figure 1:
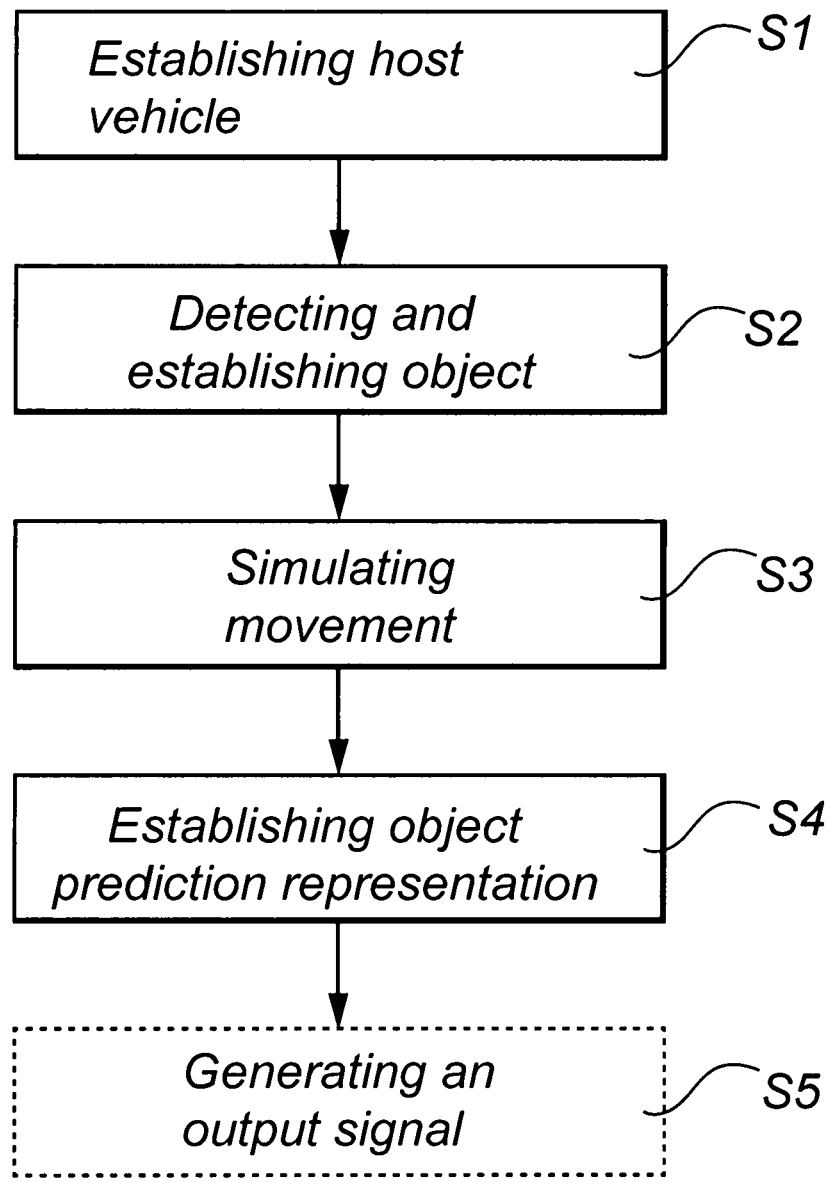
FIG. 1 is a flowchart of a method for providing an object prediction representation.

The present invention will now be described more fully hereinafter with reference to the accompanying drawings, in which exemplary embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

FIG. 1 is a flowchart of a method for providing an object prediction representation. Various scenarios using the method are present in FIGS. 2-5.

Figure 2:
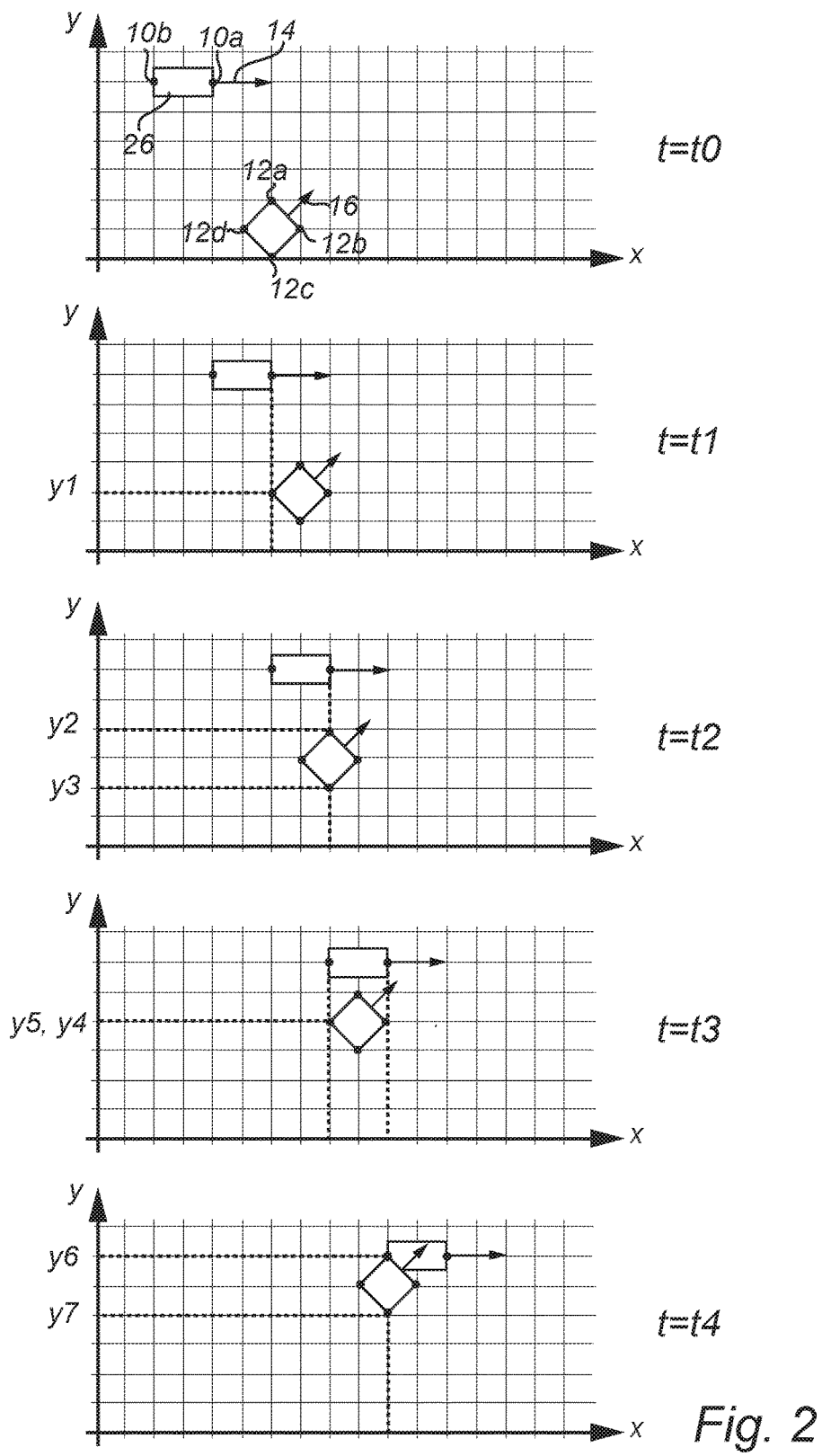
FIGS. 2-5 show various scenarios using the method.
Figure 2:
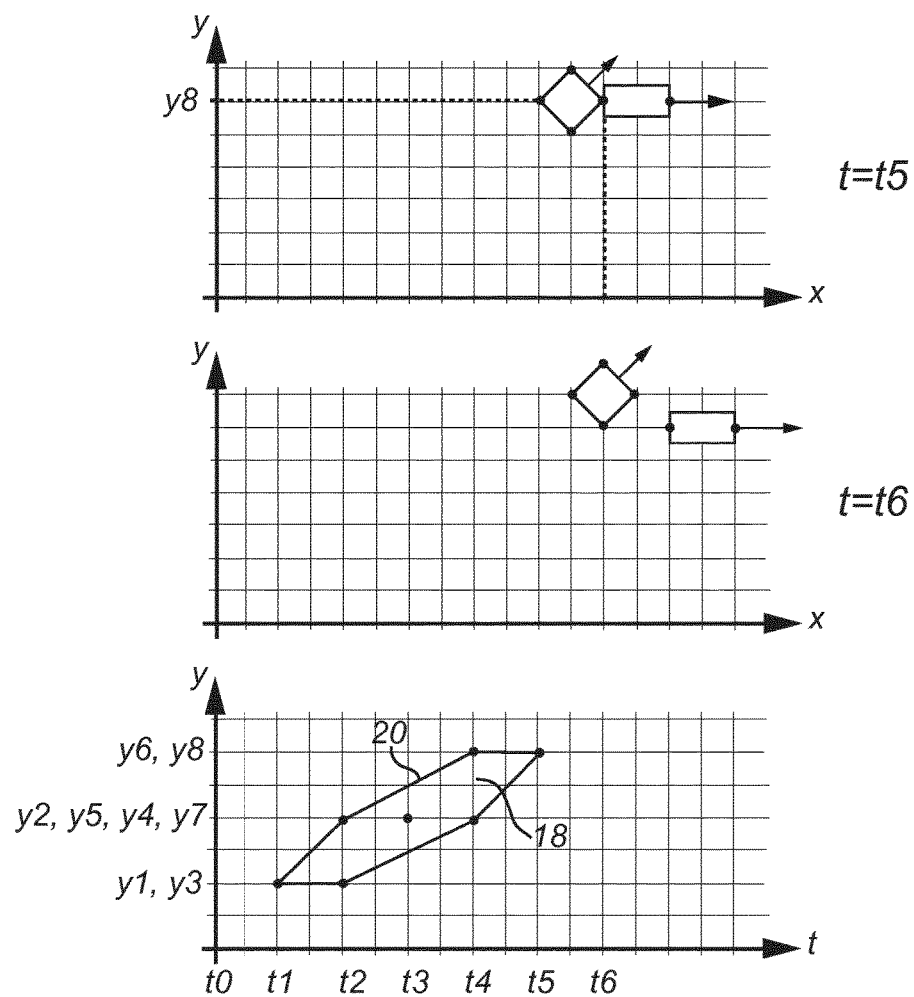

In step S1, a host vehicle is established in a longitudinal-lateral coordinate system x-y at a starting time to. The host vehicle is represented by at least one reference point in the coordinate system. In FIG. 2, the host vehicle 26 is represented by a front reference point 10a and a rear reference point 10b along the longitudinal direction of the host vehicle 26, which here corresponds to the longitudinal direction in the coordinate system. The front reference point 10a typically represents a front bumper of the host vehicle, and the rear reference point 10b typically represents a rear bumper of the host vehicle. In this way, the whole length of the vehicle is accounted for. For longer vehicles (e.g. trucks with trailers), intermediate reference points may also be used. Also, a single reference point may be used, as in FIG. 4.

In step S2 an object is detected and established in the coordinate system at the starting time t0. The object is typically another vehicle. The object is represented by a plurality of object reference points along the perimeter of the object. In FIG. 2, the object is represented by four object reference points 12a-d, one in each corner of the object/other vehicle. Depending on the size of the object and how complex its motion is, more object reference points may be used. Movement of the object at the starting time t0 is also determined. The movement, and also the object's initial position at the starting time t0 as represented by the object reference points, may for example be determined using external sensors, such as cameras and/or radar sensors, on the host vehicle. In this way, no information has to be transmitted from the object to the host vehicle. So even if the object is not equipped with means for performing this method, collision may still be avoided. Alternatively, data of the movement of the object at the starting time and also the object's initial position could be submitted from the object to the host vehicle, instead of using the external sensors.

In step S3, movements of the host vehicle and the object are simulated in the longitudinal-lateral coordinate system based on their initial positions at the starting time t0 and a movement of the host vehicle and the determined movement of the object. Preferably the coordinate system is arranged so the host vehicle's movement is longitudinal, i.e. along the x-axis of the coordinate system. The movement of the host vehicle may be constant during the simulation. Alternatively, it may vary with time. In FIG. 2, the movement of the host vehicle is represented by arrow 14, wherein the length of the arrow 14 represents the magnitude of the movement, and wherein the direction of the arrow 14 naturally represents the direction of the movement. Likewise, the movement of the object is represented by arrow 16, wherein the length of the arrow 16 represents the magnitude of the movement, and wherein the direction of the arrow 16 naturally represents the direction of the movement.

During the simulation, any points in time t0-n when the at least one reference point 10a-b of the host vehicle and an object reference point of the plurality of object reference points 12a-d have the same longitudinal position are detected. And for each detected point in time, an associated lateral position of the object reference point(s) in question at the detected point in time is detected. In other words, for each reference point of the host vehicle, the method finds the time instant when it has the same longitudinal coordinate as a reference point on the object. This gives a time instant when a certain position should be avoided. This is now further elaborated with reference to FIG. 2.

In FIG. 2, the host vehicle is travelling in the longitudinal direction, for example along a straight road. The object (other vehicle) is approaching the host vehicle from the right, and is heading in a direction towards the host vehicle such that they might collide.

At the starting time t0, none of the front and rear reference points 10a-b has the same longitudinal position as any of the object reference points 12a-d. At time t1 of the simulation, the host vehicle has moved a distance corresponding to the length of the arrow 14, in the direction of the arrow 14. Likewise, the object has moved a distance corresponding to the length of the arrow 16, in the direction of the arrow 16. Here the front reference point 10a of the host vehicle has the same longitudinal position as the (rear) object reference point 12d, whereby the associated lateral position y1 of object reference point 12d at time t1 is detected. At time t2, the front reference point 10a of the host vehicle has the same longitudinal position as the object reference points 12a and 12c, and associated lateral positions y2 and y3 are detected. At time t3, the front reference point 10a of the host vehicle has the same longitudinal position as the (front) object reference point 12b, and the rear reference point 10b of the host vehicle has the same longitudinal position as the object reference point 12d, whereby associated lateral positions y4 and y5 are detected. At time t4, the rear reference point 10b of the host vehicle has the same longitudinal position as the object reference points 12a and 12c, whereby associated lateral positions y6 and y7 are detected. At time t5, the rear reference point 10b of the host vehicle has the same longitudinal position as the object reference point 12b, whereby associated lateral position y8 is detected. At time t6, none of the front and rear reference points 10a-b has the same longitudinal position as any of the object reference points 12a-d. After time t6, the simulation may end.

Thereafter, in step S4, an object prediction representation is established in a time-lateral domain t-y based on the detected points in time and the associated lateral positions from step S3. In other words, the method has found all time instants when a certain position should be avoided, the object can be represented as a set of [t,y] points that should be avoided, that is, a certain lateral position, y, should be avoided at a certain time, t.

Returning to FIG. 2, such an object prediction representation for detected points in time t1-t5 and associated lateral positions y1-y8 is designated with reference sign 18. Furthermore, a convex hull 20 may be constructed around points in the time-lateral domain, which points are defined by the detected points in time t1-t5 and the associated lateral positions y1-y8. Basically, the convex hull is a polygon that should be avoided by a path planning algorithm.

In an optional step S5, an output signal for automatic control of the movement of the host vehicle so as to avoid the established object prediction representation 18 may be generated. The output signal may for instance be used for auto braking and/or emergency steering.

Figure 3:
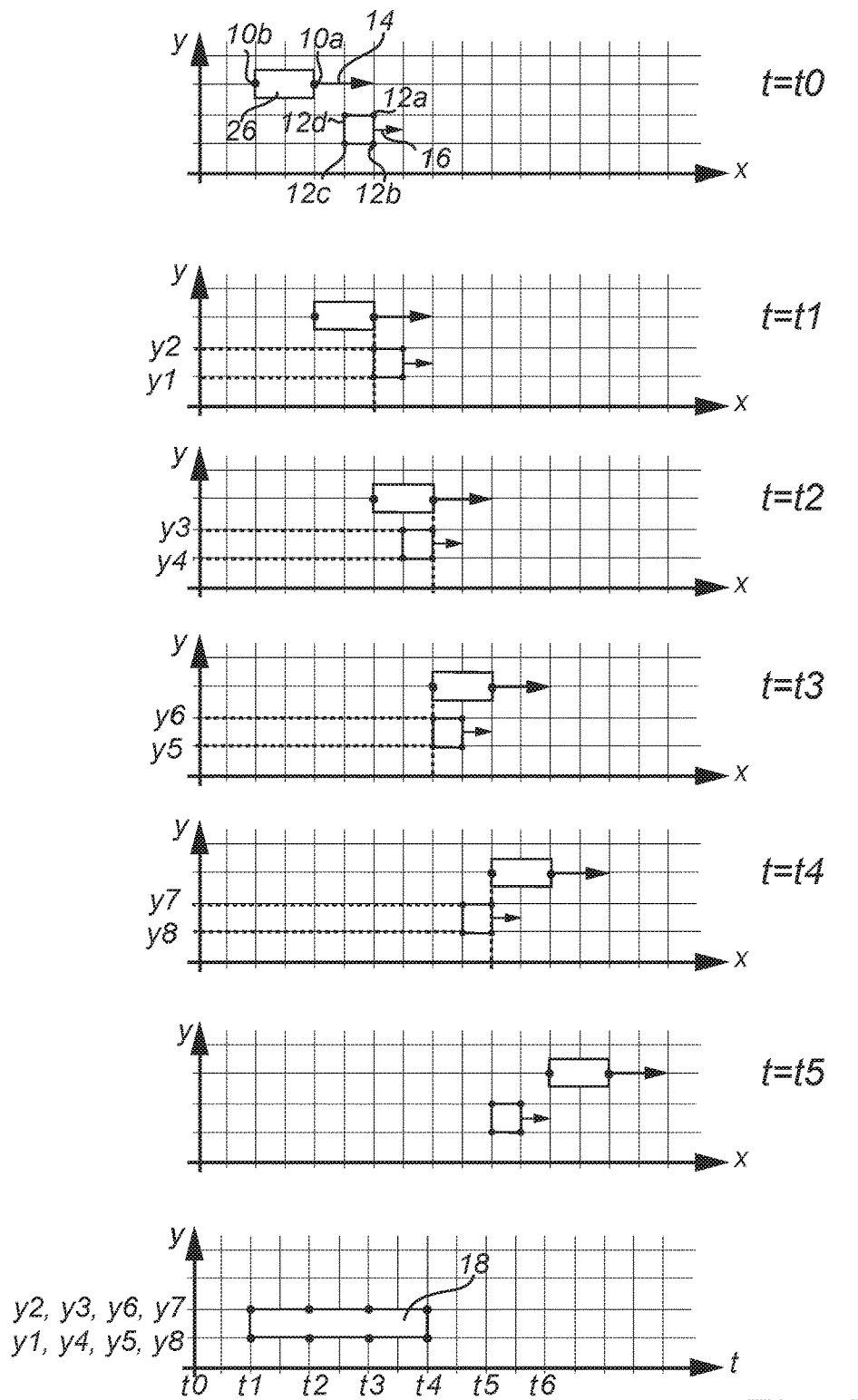

FIG. 3 shows another scenario, wherein the host vehicle and the object (other vehicle) are travelling in the same direction. However, the host vehicle has greater speed so that it will overtake the other vehicle.

In FIG. 3, at the starting time t0, none of the front and rear reference points 10a-b has the same longitudinal position as any of the object reference points 12a-d. At time t1 of the simulation, the front reference point 10a of the host vehicle has the same longitudinal position as the (rear) object reference points 12c and 12d, whereby the associated lateral position y1 of object reference point 12c and the lateral position y2 of object reference point 12d at time t1 are detected. At time t2, the front reference point 10a of the host vehicle has the same longitudinal position as the (front) object reference points 12a and 12b, and associated lateral positions y3 and y4 are detected. In the scenario of FIG. 3, lateral position y3 is the same as lateral position y2, and lateral position y4 is the same as lateral position y1. At time t3, the rear reference point 10b of the host vehicle has the same longitudinal position as the object reference points 12c and 12d, whereby associated lateral positions y5 and y6 are detected. At time t4, the rear reference point 10b of the host vehicle has the same longitudinal position as the object reference points 12a and 12b, whereby associated lateral positions y7 and y8 are detected. At time t5, none of the front and rear reference points 10a-b has the same longitudinal position as any of the object reference points 12a-d. After time t5, the simulation may end, and the object prediction representation 18 in the time-lateral domain t-y may be created. At the simulated movements in FIG. 3, there is no risk for collision, but it is nevertheless informative for the host vehicle to know that it should not turn too much to the right at certain times. In other words, there is a potential threat there, which could be of interest for a threat assessor when constructing escape paths.

Figure 4:
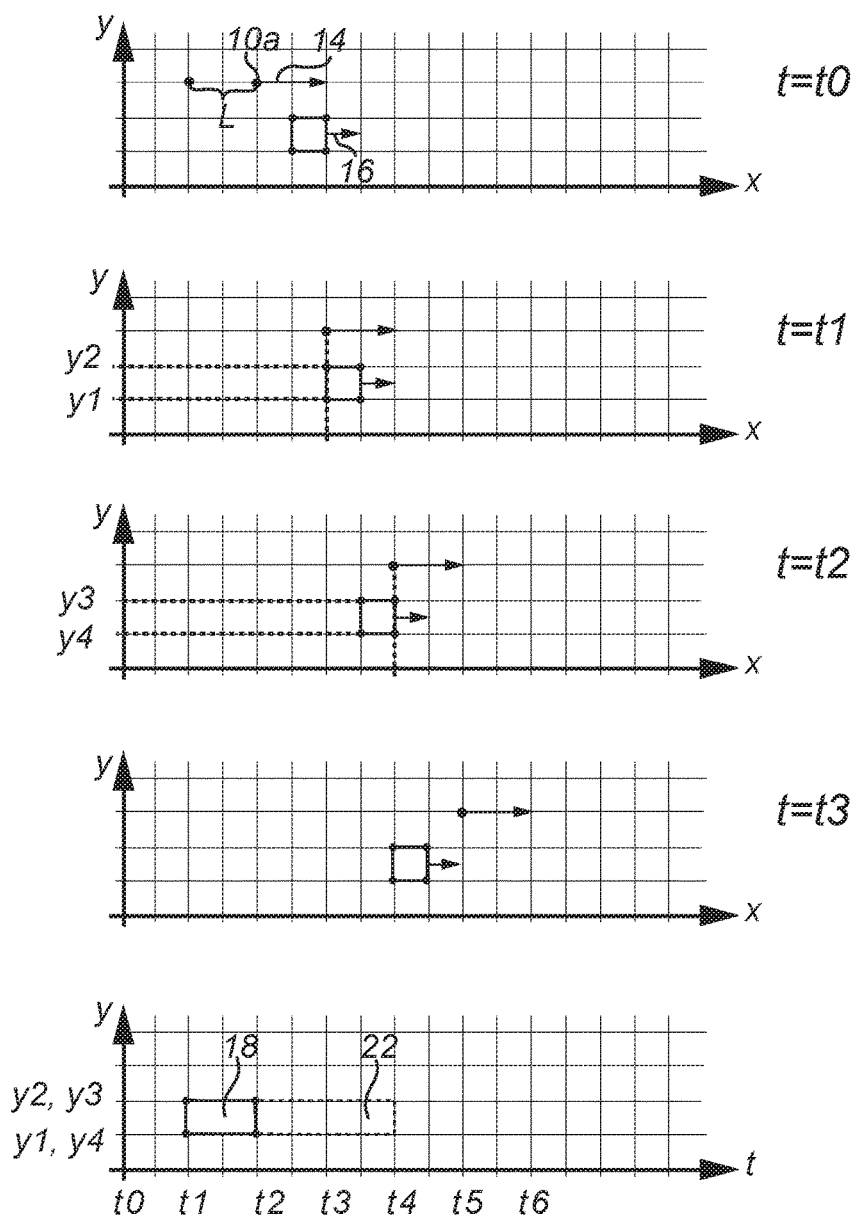

FIG. 4 is basically the same scenario as FIG. 3, but here the host vehicle is only represented by a single reference point, namely the front reference point 10a. It could alternatively be represented by another sole reference point, such as the rear reference point 10b. At the starting time t0, the front reference point 10a of the host vehicle does not have the same longitudinal position as any of the object reference points 12a-d. At time t1, the front reference point 10a of the host vehicle has the same longitudinal position as the object reference points 12c and 12d, whereby the associated lateral positions y1 and y2 are detected. At time t2, the front reference point 10a of the host vehicle has the same longitudinal position as the object reference points 12a and 12b, and associated lateral positions y3 and y4 are detected. At time t3, the front point 10a of the host vehicle again does not have the same longitudinal position as any of the object reference points 12a-d. After time t3, the simulation may end, and the object prediction representation 18 in the time-lateral domain t-y may be created.

Here it is noted that the object prediction representation 18 in FIG. 4 is smaller than the object prediction representation 18 in FIG. 3 for the same scenario. To this end, in order to account for the whole length L of the host vehicle, the established object prediction representation 18 may be extended based on the length of the host vehicle and the movement (speed and/or heading) of the host vehicle, as indicated by reference sign 22 in FIG. 4. In this way the "extended" object prediction representation provides possibility to plan avoidance maneuvers taking only a single reference point on the host vehicle into account. In the present scenario, wherein the length L of the host vehicle equals to two length units in the coordinate system, and wherein the movement is two length units per time unit along the x-axis, the object prediction representation is extended by 2×2=4 in the forward longitudinal direction.

Figure 5:
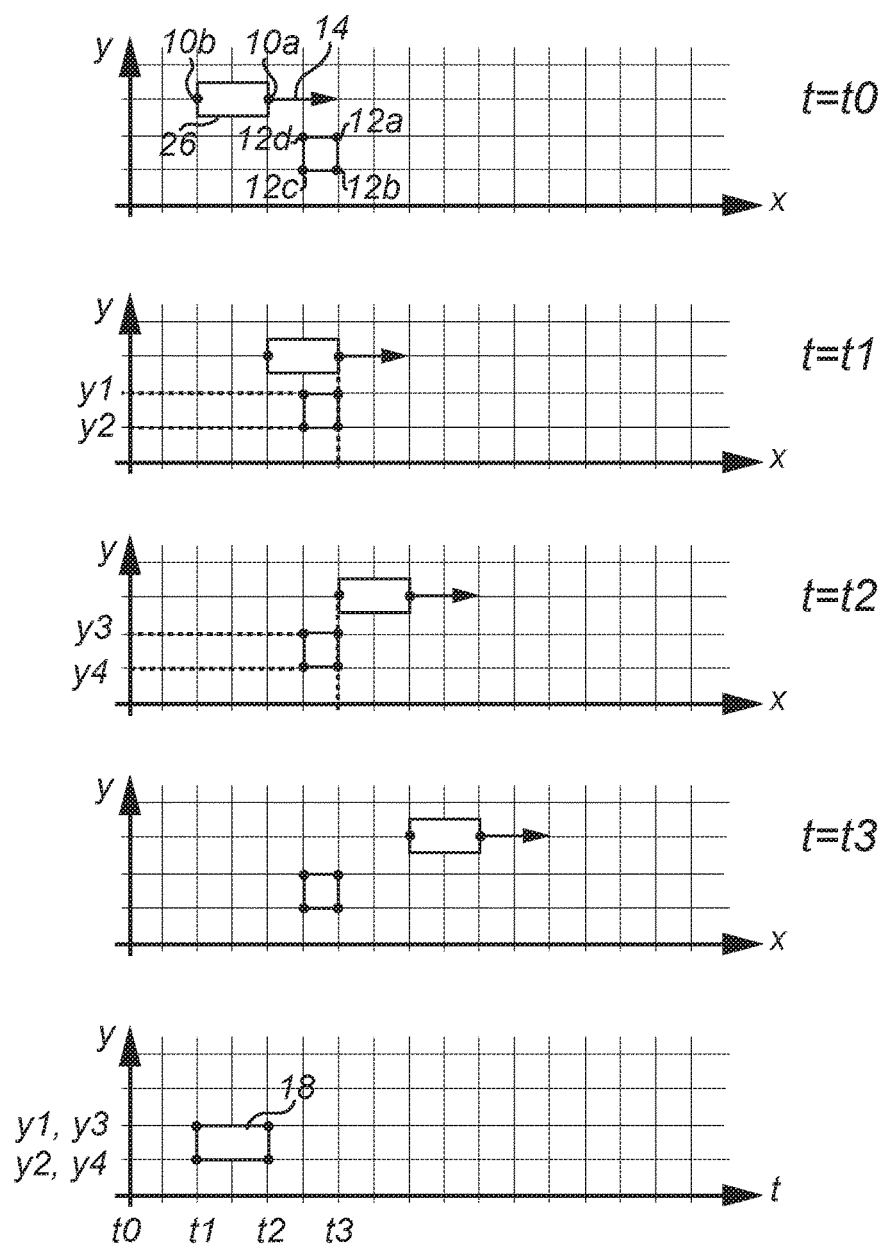

The method is also applicable to stationary objects, i.e. objects having a movement of zero, as shown in the scenario of FIG. 5. The stationary object may for instance be a road marking or a road block. At the starting time t0, none of the front and rear reference points 10a-b of the host vehicle has the same longitudinal position as any of the object reference points 12a-d. At time t1 of the simulation, the front reference point 10a of the host vehicle has the same longitudinal position as the object reference points 12a and 12b, whereby the associated lateral positions y1 and y2 are detected. At time t2, the rear reference point 10b of the host vehicle has the same longitudinal position as the object reference points 12a and 12b, and associated lateral positions y3 and y4 are detected. At time t3, none of the front and rear reference points 10a-b has the same longitudinal position as any of the object reference points 12a-d. After time t3, the simulation may end, and the object prediction representation 18 in the time-lateral domain t-y may be created.

Figure 6:
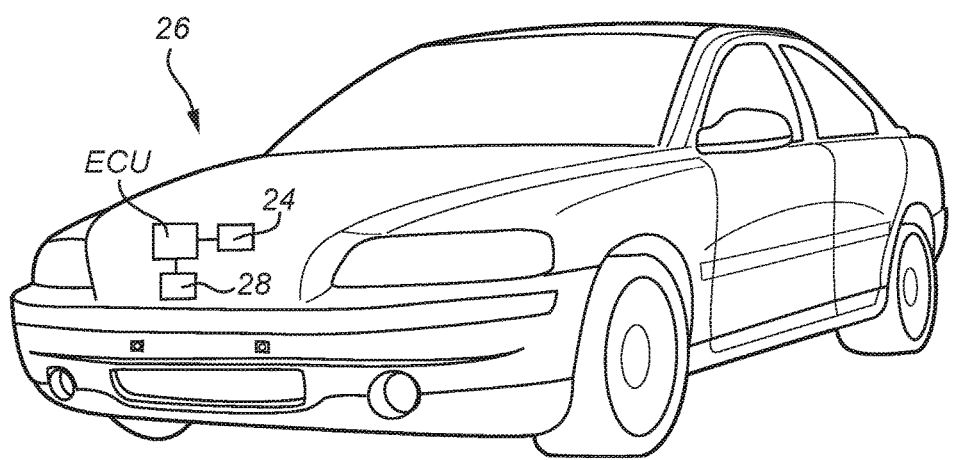
FIG. 6 is a schematic view of a vehicle.

The present method may be embodied in a computer program product 24 comprising code configured to, when executed by a processor or an electronic control unit (ECU), perform the method. The code may be stored on a computer readable medium (not shown). The ECU may in turn be arranged in the host vehicle 26, as illustrated in FIG. 6. The host vehicle 26 may for example be a car or a truck or a bus. The host vehicle 26 may be an autonomous vehicle. The aforementioned external sensors, such as cameras and/or radar sensors, are designated by reference sign 28 in FIG. 6.

Furthermore, even though only one object has been shown in the scenarios in FIGS. 2-5, the present method may simultaneously detect and provide object prediction representations for several objects.

The object prediction representation 18 established by means of the present method may beneficially be used as an input to a method for determining an evasive path for a host vehicle, such as the method disclosed in applicant's co-pending patent application entitled "METHOD FOR DETERMINING AN EVASIVE PATH FOR A HOST VEHICLE", U.S. application Ser. No. 15/307,955 filed Oct. 31, 2016, the contents of which herein is incorporated by reference.

The person skilled in the art will realize that the present invention by no means is limited to the embodiments described above. On the contrary, many modifications and variations are possible within the scope of the appended claims.

The invention claimed is:

1. A method for establishing an object prediction representation, the method comprising:
   establishing a host vehicle in a longitudinal-lateral coordinate system at a starting time, the host vehicle being represented by at least one reference point in the longitudinal-lateral coordinate system;
   detecting an object, and establishing the object in the longitudinal-lateral coordinate system at the starting time, the object being represented by a plurality of object reference points along a perimeter of the object, wherein movement of the object is determined;
   simulating movement of the host vehicle and the object in the longitudinal-lateral coordinate system based on respective initial positions of the host vehicle and the object at the starting time and a movement of the host vehicle and the movement of the object determined, wherein points in time when the at least one reference point of the host vehicle and an object reference point of the plurality of object reference points have a same longitudinal position are detected, and wherein for each detected point in time an associated lateral position of the object reference point at the detected point in time is detected; and
   establishing the object prediction representation in a time-lateral domain based on the detected points in time and the associated lateral positions.

2. The method of claim 1, wherein the at least one reference point of the host vehicle comprises a front reference point and a rear reference point along a longitudinal direction of the host vehicle, the front reference point representing the front of the host vehicle and the rear reference point representing the rear of the host vehicle.

3. The method of claim 1, wherein the at least one reference point of the host vehicle comprises a single reference point, and wherein the object prediction representation established is extended based on a length of the host vehicle and the movement of the host vehicle.

4. The method of claim 1, wherein the establishing of the object prediction representation in a time-lateral domain based on the detected points in time and the associated lateral positions includes constructing a convex hull around points, in the time-lateral domain, defined by the detected points in time and the associated lateral positions.

5. The method of claim 1, wherein the plurality of object reference points includes four object reference points, each representing a corner of the object.

6. The method of claim 1, further comprising:
   generating an output signal for automatic control of movement of the host vehicle so as to avoid the object prediction representation established.

7. The method of claim 1, wherein the object is a moving object.

8. The method of claim 1, wherein the movement of the object and the initial position of the object at the starting time are determined using at least one sensor on the host vehicle.

9. A non-transitory computer readable medium, including code which, when executed by a processor or an electronic control unit, is configured to perform at least the following:
   establishing a host vehicle in a longitudinal-lateral coordinate system at a starting time, the host vehicle being represented by at least one reference point in the longitudinal-lateral coordinate system;
   detecting an object, and establishing the object in the longitudinal-lateral coordinate system at the starting time, the object being represented by a plurality of object reference points along a perimeter of the object, wherein movement of the object is determined;
   simulating movement of the host vehicle and the object in the longitudinal-lateral coordinate system based on respective initial positions of the host vehicle and the object at the starting time and a movement of the host vehicle and the movement of the object determined, wherein points in time when the at least one reference point of the host vehicle and an object reference point of the plurality of object reference points have a same longitudinal position are detected, and wherein for each detected point in time an associated lateral position of the object reference point at the detected point in time is detected; and
   establishing an object prediction representation in a time-lateral domain based on the detected points in time and the associated lateral positions.

10. The non-transitory computer readable medium of claim 9, wherein the at least one reference point of the host vehicle comprises a front reference point and a rear reference point along a longitudinal direction of the host vehicle, the front reference point representing the front of the host vehicle and the rear reference point representing the rear of the host vehicle.

11. The non-transitory computer readable medium of claim 9, wherein the at least one reference point of the host vehicle comprises a single reference point, and wherein the object prediction representation established is extended based on a length of the host vehicle and the movement of the host vehicle.

12. The non-transitory computer readable medium of claim 9, wherein the establishing of the object prediction representation in a time-lateral domain based on the detected points in time and the associated lateral positions includes constructing a convex hull around points, in the time-lateral domain, defined by the detected points in time and the associated lateral positions.

13. The non-transitory computer readable medium of claim 9, wherein the plurality of object reference points includes four object reference points, each representing a corner of the object.

14. The non-transitory computer readable medium of claim 9, including further code which, when executed by a processor or an electronic control unit, is configured to additionally:
   generate an output signal for automatic control of movement of the host vehicle so as to avoid the object prediction representation established.

15. A vehicle, comprising:
   an electronic control unit configured to
      establish the vehicle in a longitudinal-lateral coordinate system at a starting time, the vehicle being represented by at least one reference point in the longitudinal-lateral coordinate system;
      detect an object, and establishing the object in the longitudinal-lateral coordinate system at the starting time, the object being represented by a plurality of object reference points along a perimeter of the object, wherein movement of the object is determined;
      simulate movement of the vehicle and the object in the longitudinal-lateral coordinate system based on respective initial positions of the vehicle and the object at the starting time and a movement of the vehicle and the movement of the object determined, wherein points in time when the at least one reference point of the vehicle and an object reference point of the plurality of object reference points have the same longitudinal position are detected, and wherein for each detected point in time an associated lateral position of the object reference point at the detected point in time is detected; and establish an object prediction representation in a time-lateral domain based on the detected points in time and the associated lateral positions.

16. The vehicle of claim 15, wherein the at least one reference point of the vehicle comprises a front reference point and a rear reference point along a longitudinal direction of the vehicle, the front reference point representing the front of the vehicle and the rear reference point representing the rear of the vehicle.

17. The vehicle of claim 15, wherein the at least one reference point of the vehicle comprises a single reference point, and wherein the object prediction representation established is extended based on a length of the vehicle and the movement of the vehicle.

18. The vehicle of claim 15, wherein the electronic control unit is further configured to generate an output signal for automatic control of movement of the vehicle so as to avoid the object prediction representation established.

19. The vehicle of claim 15, further comprising:
at least one sensor, wherein the movement of the object and the initial position of the object at the starting time are determined using the at least one sensor.

* * * * *